(12) United States Patent
Tomita

(10) Patent No.: US 10,827,621 B2
(45) Date of Patent: Nov. 3, 2020

(54) DISPLAY DEVICE

(71) Applicant: Sharp Kabushiki Kaisha, Sakai (JP)

(72) Inventor: Yasukazu Tomita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/469,164

(22) PCT Filed: Jan. 9, 2018

(86) PCT No.: PCT/JP2018/000160
§ 371 (c)(1),
(2) Date: Jun. 13, 2019

(87) PCT Pub. No.: WO2018/131554
PCT Pub. Date: Jul. 19, 2018

(65) Prior Publication Data
US 2019/0357357 A1 Nov. 21, 2019

(30) Foreign Application Priority Data
Jan. 13, 2017 (JP) ................................. 2017-003976

(51) Int. Cl.
*H05K 1/18* (2006.01)
*G06F 3/044* (2006.01)
(Continued)

(52) U.S. Cl.
CPC ......... *H05K 1/189* (2013.01); *G02F 1/13338* (2013.01); *G02F 1/13452* (2013.01);
(Continued)

(58) Field of Classification Search
CPC combination set(s) only.
See application file for complete search history.

(56) References Cited

U.S. PATENT DOCUMENTS 7,529,100 B2 * 5/2009 Chuang ................. H05K 1/028
174/254
8,497,430 B2 7/2013 Kuwajima
(Continued)

FOREIGN PATENT DOCUMENTS

JP  2004-212447 A  7/2004
JP  2007-057885 A  3/2007
(Continued)

OTHER PUBLICATIONS

Official Communication issued in International Patent Application No. PCT/JP2018/000160, dated Mar. 20, 2018.

*Primary Examiner* — Christopher E Leiby
(74) *Attorney, Agent, or Firm* — Keating & Bennett, LLP

(57) ABSTRACT

A display device includes a display panel, a functional unit, a first flexible substrate, a display driving component, and a second flexible substrate. The display panel includes a first substrate and a second substrate. The second substrate includes a portion overlapping the first substrate and a non-overlapping portion not overlapping the first substrate. The first flexible substrate is connected to the non-overlapping portion. The first flexible substrate includes an insulator base with flexibility and an insulating coating portion disposed between the display driving component and the second flexible substrate. The display driving component is mounted on the non-overlapping portion to process a signal from the first flexible substrate and to supply the processed signal to the display panel. The second flexible substrate is connected to the first substrate to transmit a signal for driving the functional unit. The second flexible substrate is disposed to overlap the non-overlapping portion.

4 Claims, 6 Drawing Sheets

(51) Int. Cl.
*G02F 1/1333* (2006.01)
*G02F 1/1345* (2006.01)
*G06F 3/041* (2006.01)
*H05K 1/14* (2006.01)

(52) U.S. Cl.
CPC .......... G06F 3/0412 (2013.01); G06F 3/0446 (2019.05); H05K 1/147 (2013.01); *G06F 2203/04102* (2013.01); *H05K 2201/09909* (2013.01); *H05K 2201/10136* (2013.01)

(56) References Cited

U.S. PATENT DOCUMENTS

| | | | | |
|---|---|---|---|---|
| 2006/0027909 | A1* | 2/2006 | Kobayashi | G02F 1/13452 257/688 |
| 2008/0049077 | A1* | 2/2008 | Sugahara | B41J 2/1626 347/70 |
| 2008/0165158 | A1* | 7/2008 | Hotelling | G06F 3/044 345/174 |
| 2009/0194342 | A1* | 8/2009 | Kuo | H05K 1/118 178/18.03 |
| 2010/0220072 | A1* | 9/2010 | Chien | G06F 3/041 345/173 |
| 2010/0295800 | A1* | 11/2010 | Kuo | H05K 3/0058 345/173 |
| 2010/0331060 | A1* | 12/2010 | Yoshida | H01R 35/00 455/575.1 |
| 2011/0115731 | A1* | 5/2011 | Kuwajima | G06F 3/041 345/173 |
| 2011/0187677 | A1* | 8/2011 | Hotelling | G06F 3/0416 345/174 |
| 2011/0242028 | A1* | 10/2011 | Lee | G06F 3/0418 345/173 |
| 2012/0146919 | A1* | 6/2012 | Kim | G06F 3/044 345/173 |
| 2012/0235948 | A1* | 9/2012 | Inoue | G02F 1/13338 345/173 |
| 2012/0319966 | A1* | 12/2012 | Reynolds | G06F 3/041 345/173 |
| 2012/0319967 | A1* | 12/2012 | Tsai | G06F 3/041 345/173 |
| 2014/0233166 | A1* | 8/2014 | O'Shea | H05K 1/189 361/679.02 |
| 2014/0292686 | A1* | 10/2014 | Yamamoto | G06F 3/0416 345/173 |
| 2015/0002759 | A1* | 1/2015 | Nakano | H05K 1/189 349/12 |
| 2016/0062520 | A1* | 3/2016 | Choi | H01L 51/56 345/174 |
| 2016/0109998 | A1* | 4/2016 | Watanabe | G06F 3/044 349/12 |
| 2016/0216736 | A1* | 7/2016 | Hong | G06F 3/0412 |
| 2017/0102598 | A1* | 4/2017 | Nakada | G06F 3/0412 |
| 2017/0205928 | A1* | 7/2017 | Noguchi | G06F 3/0412 |
| 2018/0031943 | A1* | 2/2018 | Yamazaki | G02F 1/1333 |
| 2018/0203555 | A1* | 7/2018 | Miyamoto | H01L 27/323 |
| 2018/0204884 | A1* | 7/2018 | Isa | H01L 27/323 |
| 2019/0357357 | A1* | 11/2019 | Tomita | G06F 3/04164 |

FOREIGN PATENT DOCUMENTS

| | | |
|---|---|---|
| JP | 2011-107389 A | 6/2011 |
| JP | 2014-077857 A | 5/2014 |
| JP | 2016-142801 A | 8/2016 |

\* cited by examiner

DISPLAY DEVICE

TECHNICAL FIELD

The technology disclosed by the specification relates to a display device.

BACKGROUND ART

Conventionally, a display device for use in products such as electronic devices is configured to include a display panel which displays an image, a display driving component (such as an integrated circuit driver) for causing an image to be displayed, and a flexible substrate which transmits a signal for image display to the display driving component. In recent years, a display device has been often used in which a display panel has internally or externally inserted therein another functional unit, for example, a touch panel pattern, to provide not only an image display function but also an image control function. In this case, the functional unit such as the touch panel pattern has connected thereto a separate functional-unit-purpose flexible substrate which transmits a signal for controlling this functional unit.

In this structure, the position of the functional-unit-purpose flexible substrate or the like may be deviated, depending on the dimensional accuracy, mounting accuracy, or the like of each member. For example, PTL 1 described below discloses technology of a display device configured to have a display panel and a touch panel electrically connected via separate flexible substrates, wherein in order to eliminate a deviation of interface terminals of both of the flexible substrates due to a positional deviation between the display panel and the touch panel, terminals formed on the respective flexible substrates are electrically connected.

RELATED ART DOCUMENT

Patent Literature

Japanese Unexamined Patent Application Publication No. 2011-107389

Problem to be Solved by the Invention

In view of supporting high definition of a display image, a display device of a so-called COG (Chip on Glass) mounting scheme has been often used in which a display driving component is mounted on an outer circumferential portion of a transparent substrate (glass substrate) configuring a display panel. When the COG mounting scheme is adopted in the display device including the functional unit as described above, the arrangement may be such that the functional-unit-purpose flexible substrate and the COG-mounted display driving component are overlaid each other in a plan view, that is, when viewed from the direction of the normal of the plate surface of the display panel. In this device, when the functional-unit-purpose flexible substrate is positionally deviated, the terminal formed on the functional-unit-purpose flexible substrate is brought close to the display driving component, and there is a possibility that the potential of the display driving component is transferred from the functional-unit-purpose flexible substrate to the functional-unit-purpose driving component or the like to cause the functional unit or the like to erroneously operate. To prevent this erroneous operation, it is required to take measures such as affixing an insulation tape onto the display driving component, and a member and/or step for this has to be added.

DISCLOSURE OF THE PRESENT INVENTION

The present technology has been completed based on the circumstances as described above, and has an object of achieving insulation between the functional-unit-purpose flexible substrate and the display driving component with a simple structure.

Means for Solving the Problem

A display device disclosed in the specification includes a display panel, a functional unit, a first flexible substrate, a display driving component, and a second flexible substrate. The display panel includes a pair of substrates. The functional unit installed in or on the display panel. The first flexible substrate includes an insulator base with insulation properties and flexibility. The first flexible substrate is configured to transmit a signal for driving the display panel. The display driving component is configured to process the signal from the first flexible substrate and to supply the processed signal to the display panel for driving the display panel to display an image. The second flexible substrate has flexibility. The second flexible substrate is configured to transmit a signal for driving the functional unit. The pair of substrates includes a first substrate and a second substrate. The first substrate is disposed on a display surface side of the display panel. The second substrate includes a portion overlapping the first substrate in a plan view and a non-overlapping portion not overlapping the first substrate in the plan view. The non-overlapping portion includes a side edge disposed outer than a side edge of the first substrate. The first flexible substrate is connected to the non-overlapping portion. The display driving component is mounted on the non-overlapping portion. The second flexible substrate includes an end connected to the first substrate. The second flexible substrate is disposed to at least partially overlap the non-overlapping portion in a plan view. The first flexible substrate includes an insulating coating portion having insulation properties. The insulating coating portion is disposed between the display driving component and the second flexible substrate.

According to the above-described structure, in the display device having the display driving component COG-mounted thereon, when the first flexible substrate is connected to the display panel, the insulating coating portion as a portion of the first flexible substrate is disposed between the display driving component and the second flexible substrate, thereby allowing insulation between the display driving component and the second flexible substrate. This allows reduction in unintended potential conduction of the display driving component via the second flexible substrate while omitting a step only for the purpose of achieving insulation between both members and inhibition of erroneous operation of the display device. Since the insulating coating portion is formed as a portion of the first flexible substrate, it is not required to separately prepare or manage a member for insulation. As a result, for example, compared with a structure in which an insulation tape is affixed to the display driving component, it is possible to stabilize the operation of the display device, while achieving reduction in the number of operations, the number of components, and cost. In the specification, a "unit" means a minimum unit which provides a specific function, cannot be used as being further broken down, and functions as a unity, and whether the component is single or plural and so forth does not matter.

As modes of the display device according to the present technology, the following structures are preferable.

(1) The insulating coating portion is formed of the insulator base.

According to this structure, the insulator base can be formed by only changing the shape of a portion of the insulator base configuring the first flexible substrate. This allows insulation between the second flexible substrate and the display driving component with a simple structure without inviting a significant increase in cost or the like.

(2) The insulator base includes a terminal formation area in which a terminal electrically connected to the second substrate is formed, a terminal non-formation area in which no terminal is formed, and an extended portion. The extended portion extends from the terminal non-formation area and includes a base end adjacent to the terminal non-formation area. The insulating coating portion includes in the extended portion.

With a portion of the insulator base being disposed between the second flexible substrate and the display driving component, there is a possibility that the insulator base is deformed due to the shape of the display driving component, in particular, the thickness or the like to cause stress to occur inside the insulator base. According to the above-described structure, the extended portion having the insulating coating portion takes the terminal non-formation area as a base end, and the extended portion and the terminal formation area are not directly connected. Therefore, the stress occurring to the extended portion is not directly transferred to the terminal formation area, and the influence of the stress to an electrical connection portion can be inhibited. Thus, the effects as described above can be acquired, while favorable connection between the display panel and the first flexible substrate is kept.

(3) The extended portion includes a curved portion curved in a plan view. The curved portion is between the insulating coating portion and the base end.

According to this structure, the insulator base having flexibility is easily deformed at the curved portion, and the stress occurring inside the insulator base is absorbed by deformation and displacement of the curved portion. Thus, conduction of stress to the terminal non-formation area at the base end of the extended portion and, in turn, to the terminal formation area, can be more inhibited.

(4) The insulating coating portion is bonded to the driving component with a bonding agent layer.

According to this structure, even if a vibration or impact is added to the display device, the insulating coating portion is not deviated from the display driving component, and the insulation effect can be kept. This allows stable insulation between the display driving component and the second flexible substrate.

(5) The display device further includes a metal layer disposed between the insulating coating portion and the display driving component.

According to this structure, by giving the metal layer a role as a heat-dissipating material, heat generated at the time of operation of the display driving component is dissipated to allow an increase in temperature to be inhibited. As a result, even if a high load is exerted on the display driving component, the display driving component can be stably operated.

(6) The functional unit is a touch panel installed in the display panel.

When the functional unit is a touch panel internally inserted into the display panel, it is not possible to achieve insulation with the display driving component by using a portion of the structure of the functional unit, for example, by causing a portion of the functional unit to protrude onto the display driving component. Even in this display device, according to the present technology, insulation between the display driving component and second flexible substrate can be achieved with a simple structure.

Advantageous Effect of the Invention

According to the present technology, transfer of the potential of the display driving component COG-mounted on the display panel to another member against the design intention of the device is reduced, erroneous operation of the driving component and the control component is inhibited, and the operation of the display device can be stabilized.

BEST MODE FOR CARRYING OUT THE INVENTION

First Embodiment

Figure 1:
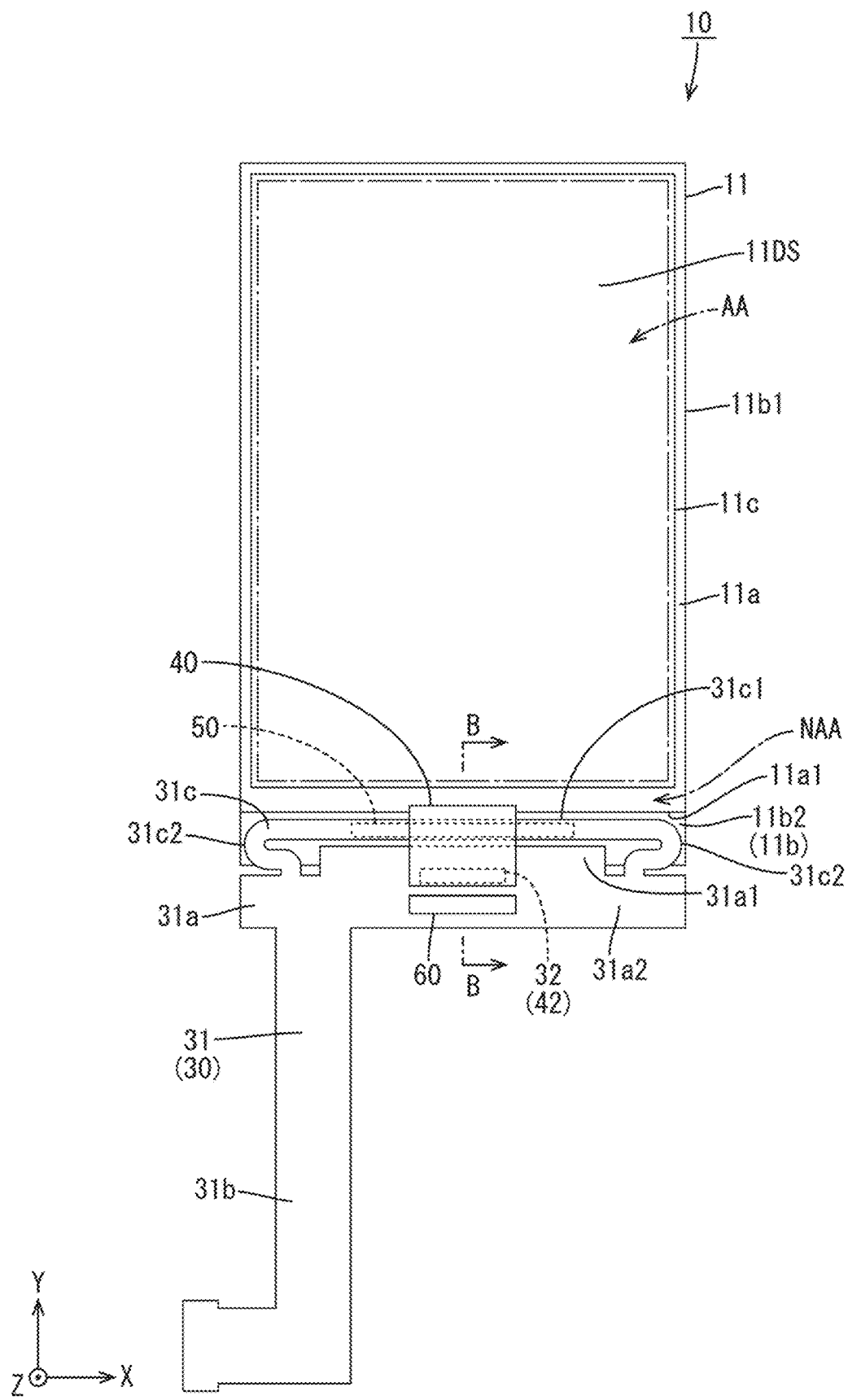
FIG. 1 is a schematic plan view depicting connection structure of a liquid crystal panel, a liquid crystal display flexible substrate (first flexible substrate), a touch panel flexible substrate (second flexible substrate), a liquid crystal display driver (display driving component), and a touch driver in a liquid crystal display device according to a first embodiment.
Figure 2:
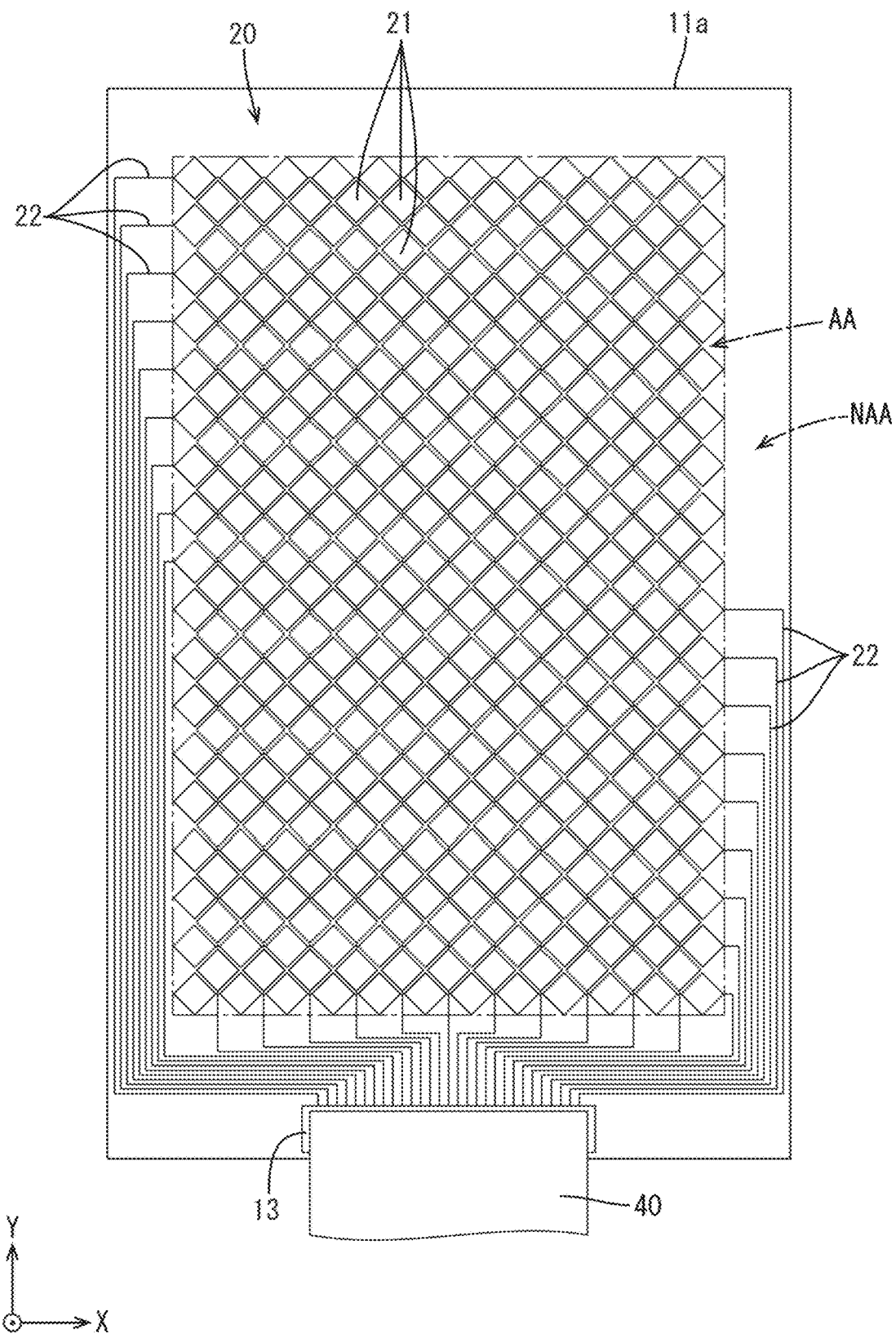
FIG. 2 is a plan view of a CF substrate having a touch panel patter.
Figure 3:
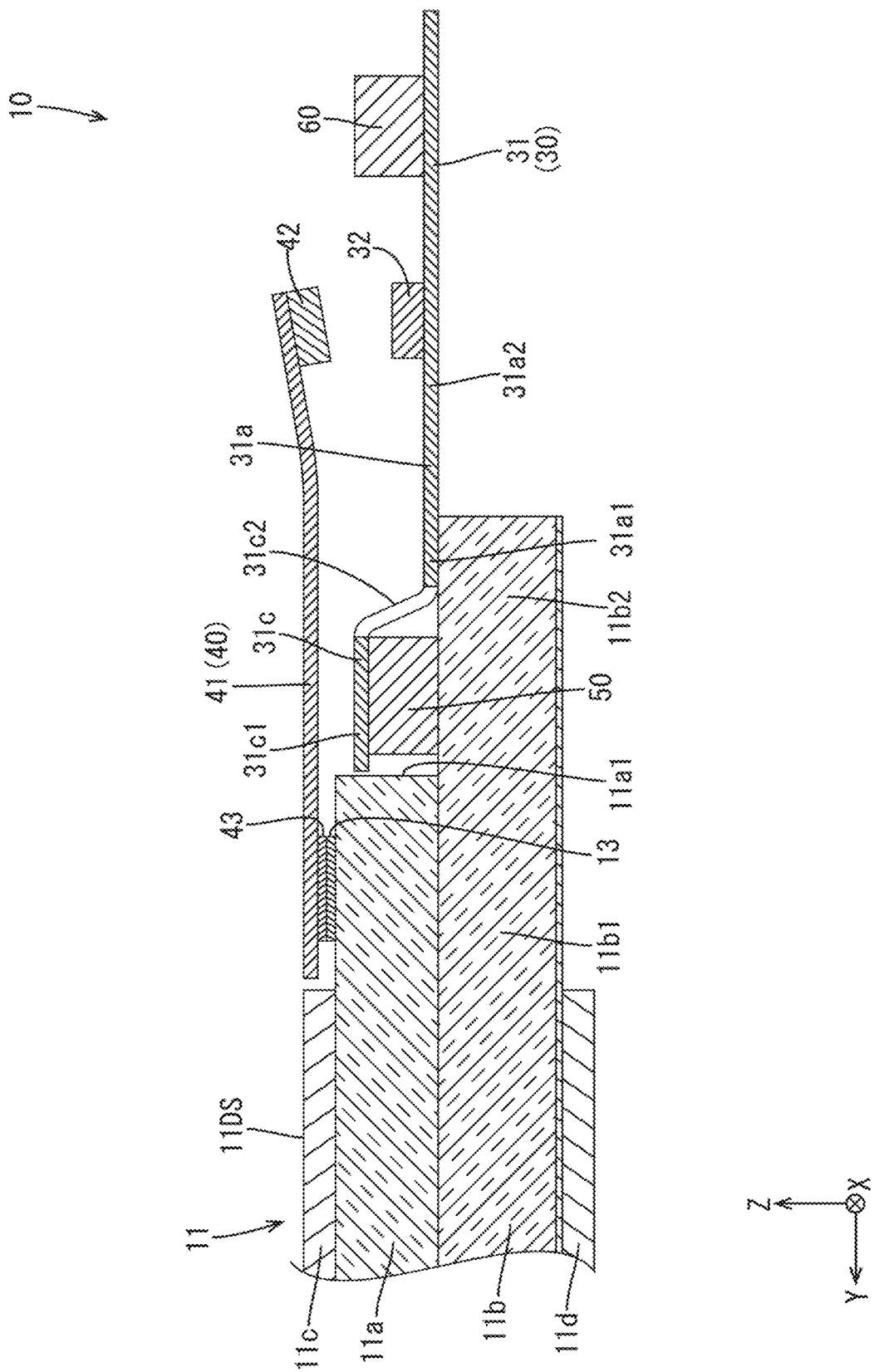
FIG. 3 is a cross-sectional view along line B-B in FIG. 1.

A first embodiment is described based on FIG. 1 to FIG. 3. In the present embodiment, a liquid crystal display device (display device) 10 with a touch panel function is exemplarily described. Note that an X axis, a Y axis, and a Z axis are depicted in part of each drawing and each axial direction is rendered so as to indicate the same direction in each drawing. As for a vertical direction, FIG. 3 is taken as a reference, with an upper side in the drawing taken as a front side and a lower side in the drawing taken as a back side.

The liquid crystal display device 10 according to the present embodiment is used for various electronic devices (not depicted), such as portable telephone terminals (including smartphones and so forth), notebook personal computers (including tablet-type notebook personal computers), wearable terminals (including smartwatches), portable-type information terminal (including electronic books, PDAs, and so forth), portable-type game machines, and digital photo frames. Thus, the screen size of a liquid crystal panel 11 is on the order of several inches to a little over ten inches and is, in general, a size classified as a small size or a small and medium size.

A general outline of the structure of the liquid crystal display device 10 is described.

As depicted in FIG. 1, the liquid crystal display device 10 has a longitudinally-elongated rectangular shape as a whole, and includes the liquid crystal panel (display panel) 11 with a plate surface on the front side as a display surface 11DS that can display images. In the liquid crystal panel 11, a touch panel pattern (functional unit) 20 is internally inserted, which will be described further below with reference to FIG. 2. The liquid crystal panel 11 has connected thereto a liquid crystal display flexible substrate (first flexible substrate) 30 which transmits a signal for driving this liquid crystal panel and a touch panel flexible substrate (second flexible substrate) 40 which transmits a signal from the touch panel pattern 20 and a signal to the touch panel pattern 20, and has mounted thereon a liquid crystal display driver (display driving component) 50 which processes a signal from the liquid crystal display flexible substrate 30 for supply to the liquid crystal panel 11. The liquid crystal display flexible substrate 30 has mounted thereon a touch driver 60 which processes a detection signal from the touch panel pattern 20 and supplies a control signal to the touch panel pattern 20. On the front side of the liquid crystal panel 11, for example, a frame-shaped member (bezel) not depicted is arranged to allow a structure of catching and holding an outer peripheral portion (non-display area NAA, which will be described further below) of the liquid crystal panel 11. On the back side of the liquid crystal panel 11, a backlight device which applies illumination light for display may further be included.

First, the liquid crystal panel 11 is described.

As depicted in FIG. 1, the liquid crystal panel 11 forms a rectangular shape as a whole in a plan view. In FIG. 1 to FIG. 3, the liquid crystal panel 11 is rendered so that its short-side direction matches the X-axis direction, the long-side direction matches the Y-axis direction, and the thickness direction matches the Z-axis direction. On the liquid crystal panel 11, a display area (active area) AA on a screen center side where images are displayed and a non-display area (non-active area) NAA, where images are not displayed, on a screen outer peripheral side forming a picture-frame shape (frame shape) which surrounds the display area AA are defined. In FIG. 1, the contour of the display area AA is indicated by a one-dot-chain line. As illustrated in the drawing, on the liquid crystal panel 11 according to the present embodiment, the display area AA is defined as a rectangular shape.

As illustrated in FIG. 3, the liquid crystal panel 11 has paired substrates 11a and 11b. Both of the substrates 11a and 11b are affixed together, with a sealing compound not depicted, in a state of being separated with a predetermined gap (cell gap) so that plate surfaces are opposed to each other. Enclosed between both of the substrates 11a and 11b is a liquid crystal layer (not depicted) containing liquid crystal molecules, which are substances with optical characteristics changed with the application of an electrical field. Both of the substrates 11a and 11b each include a glass substrate made of no-alkali glass, quartz glass, or the like and excellent in transmittance, and a plurality of films are stacked on each glass substrate by a known photolithography method or the like.

Of both of the substrates 11a and 11b, one disposed above (front side) is taken as a CF substrate (color filter substrate, opposing substrate. first substrate) 11a, and one disposed below (back side) is taken as an array substrate (active matrix substrate, element substrate. second substrate) 11b. A glass substrate of the array substrate 11b is provided with a switching element (for example, TFT) connected to a source line and a gate line that are orthogonal to each other and structures (not depicted) such as a pixel electrode and an alignment film connected to that switching element. On the other hand, the CF substrate 11a is provided with, in addition to a color filter with each of color portions such as R (red), G (green), and B (blue) arranged in a predetermined array and a light-shielding portion (black matrix) which divides adjacent color portions, structures (not depicted) such as an opposing electrode and an alignment film.

As depicted in FIG. 1 and FIG. 3, the CF substrate 11a has a short-side length dimension substantially equivalent to the array substrate 11b, but has a long-side length dimension smaller than the array substrate 11b and is affixed in a state with a side edge forming one short side (on an upper side depicted in FIG. 1) being aligned with the array substrate 11b. Therefore, in a side edge portion including the other short side (on a lower side depicted in FIG. 1) of the array substrate 11b, an area where the CF substrate 11a is not overlaid over a predetermined range is present. In the following, in the array substrate 11b, an area overlaid on the CF substrate 11a in a plan view is taken as a CF substrate overlapping portion 11b1, and an area not overlaid on the CF substrate 11a in a plan view and disposed on the side of the CF substrate overlapping portion 11b1 is taken as a CF substrate non-overlapping portion (non-overlapping portion) 11b2. As depicted in FIG. 1, the above-described display area AA is defined in an area where the CF substrate 11a and the array substrate 11b are overlaid each other, and the entire CF substrate non-overlapping portion 11b2 of the array substrate 11b is taken as the non-display area NAA. In the following, of side edges of the CF substrate 11a, a side edge on a CF substrate non-overlapping portion 11b2 side is taken as a first side edge (a side edge) 11a1.

As depicted in FIG. 3, to outer surface sides of both of the substrates 11a and 11b, polarizing plates 11c and 11d are respectively attached. As with each of the substrates 11a and 11b, each of the polarizing plates forms a rectangular shape in a plan view, has dimensions slightly smaller than the CF substrate 11a, and is arranged so as to be substantially concentric with the CF substrate 11a. Thus, while the outer surface of the CF substrate 11a is exposed with a substantially uniform width over the entire periphery, the outer surface of the array substrate 11b is exposed so that one short-side portion is wider by the CF substrate non-overlapping portion 11b2 compared with the other side portions. The surface of the polarizing plate 11c affixed to the front side of the CF substrate 11a configures the display surface 11DS. On an inner surface side of each of both of the substrates 11a and 11b, an alignment film (not depicted) for orienting the liquid crystal molecules contained in the liquid crystal layer is formed.

Next, the touch panel pattern 20 is described.

In the liquid crystal panel 11 according to the present embodiment, as described above, the touch panel pattern 20 is internally inserted. The touch panel pattern 20 provides a touch panel function (position input function) of detecting a position (input position) where a user provides an input based on a displayed image. In the present embodiment, the liquid panel 11 is exemplarily described, with the touch panel pattern 20 for achieving the touch panel function integrated as semi-in-cell (on-cell). The touch panel pattern 20 is of a so-called projection capacitive type, and its detection type can be a mutual capacitive type. In this case, as depicted in FIG. 2, the touch panel pattern 20 at least includes a plurality of touch electrodes (position detection electrodes) 21 provided to the CF substrate 11a and disposed so as to be aligned in a matrix in a plane of the display surface 11DS of the CF substrate 11a. The touch electrodes 21 are disposed in the display area AA of the CF substrate 11a. Therefore, the display area AA in the liquid crystal panel 11 substantially matches a touch area where an input position can be detected, and the non-display area NAA substantially matches a non-touch area where an input position cannot be detected. In the non-display area NAA of the CF substrate 11a as a non-touch area outside the touch area, peripheral lines 22 are disposed, each with one end side connected to any touch electrode 21 and the other end side connected to a CF substrate-purpose terminal 43 connected to a touch panel flexible substrate 40. In this liquid crystal panel 11, when a finger (position input body) not depicted as a conductive material is brought close to the display surface 11DS so that the user tries to input a position based on a visually-recognized image in the display area AA, a capacitance is formed between that finger and the touch electrodes 21. This causes a change in the capacitance detected by the touch electrode 21 near the finger as the finger is brought near, and the capacitance becomes different from that of the touch electrode 21 away from the finger. Based on this, the input position can be detected.

Next, the liquid crystal display driver 50 is described.

As depicted in FIG. 1 and FIG. 3, on the array substrate 11b of the liquid crystal panel 11, the liquid crystal display driver 50 which processes a signal for driving the liquid crystal panel 11 is mounted. The liquid crystal display driver 50 according to the present embodiment is formed of an LSI chip having a drive circuit therein, processes an input signal supplied from a control circuit board not depicted as a signal supply source to generate an output signal, and outputs that output signal to the display area AA of the liquid crystal panel 11. This liquid crystal display driver 50 forms a long prismatic shape, and is mounted on the surface of the CF substrate non-overlapping portion 11b2 of the array substrate 11a so as to be along the first side edge 11a1 of the CF substrate 11a, that is, with a longitudinal direction matching the X-axis direction and a short direction matching the Y-axis direction.

Next, the liquid crystal display flexible substrate 30 is described.

As depicted in FIG. 1 and FIG. 3, to the array substrate 11b of the liquid crystal panel 11, the liquid crystal display flexible substrate 30 for transmitting a signal from a control substrate not depicted to the liquid crystal panel 11 is connected. The liquid crystal display flexible substrate 30 includes an insulator base 31 made by forming a synthetic resin material made of an insulating material with flexibility into a film shape (sheet shape), has a pattern of many lines not depicted and routed and formed on this insulator base 31, has high bending flexibility (flexibility, deformation ease) compared with a glass substrate and so forth, and can be easily bent and folded. As a synthetic resin material configuring the insulator base 31, for example, polyimide, PET, or the like can be used.

As depicted in FIG. 1, the insulator base 31 is formed so as to form a substantially L shape as a whole in a plan view, and has a main body 31a extending in the X-axis direction and connected to the CF substrate non-overlapping portion 11b2 of the array substrate 11b and a projecting portion 31b projecting from the main body 31a toward a side opposite to the liquid crystal panel 11 along the Y-axis direction. An extended end of the projecting portion 31b is provided with a control substrate connector, and is electrically connected to a control substrate not depicted as a supply source of various signals. A middle portion of a side edge of the main body 31a on a liquid crystal panel 11 side protrudes in a rectangular shape toward the array substrate 11b, and this protruding portion is taken as a terminal formation area 31a1, and here formed is a panel-connection-purpose terminal. The panel-connection-purpose terminal is electrically and mechanically connected via an anisotropic conductive film (ACF) to a panel-side terminal not depicted and disposed in the CF substrate non-overlapping portion 11b2 of the array substrate 11b. Other portions of the main body 31a are taken as a terminal non-formation area 31a2 where no terminal is formed. In the insulator base 31 according to the present embodiment, with this terminal non-formation area 31a2 being as a base end, an extended portion 31c is formed. Details about the extended portion 31c are described further below.

Next, the touch driver 60 is described.

As depicted in FIG. 1 to FIG. 3, on the liquid crystal display flexible substrate 30, the touch driver 60 which processes a detection signal based on the potential detected at the touch electrode 21 and supplies a control signal for controlling driving of the touch panel pattern 20 is mounted. The touch driver 60 forms a prismatic shape having a length approximately on the order of ½ of the liquid crystal display driver 50, and is mounted on the terminal non-formation area 31a2 of the main body 31a on the surface of the insulator base 31 so as to be along a side edge opposite to the liquid crystal panel 11 of the main body unit 31a, that is, with a longitudinal direction matching the X-axis direction and a short direction matching the Y-axis direction. The liquid crystal display flexible substrate 30 is provided with a line not depicted and connecting the touch driver 60 and a touch-panel-substrate-purpose terminal 32, which will be described further below, thereby making the touch panel flexible substrate 40, which will be described further below, and the touch driver 60 electrically connected together.

Next, the touch panel flexible substrate 40 is described.

As depicted in FIG. 1 to FIG. 3, to the CF substrate 11a of the liquid crystal panel 11, the touch panel flexible substrate 40 is connected, which transmits a detection signal based on the potential detected at the touch electrode 21 via the liquid crystal display flexible substrate 30 to the touch driver 60 and transmits a control signal for controlling driving of the touch panel pattern 20 supplied from the touch driver 60 to the touch electrode 21. The touch panel flexible substrate 40 includes, as with the liquid crystal display flexible substrate 30, an insulator base made by forming a synthetic resin material such as polyimide or PET made of an insulating material with flexibility into a film shape (sheet shape), and has a pattern of many lines not depicted and routed and formed on this insulator base.

The touch panel flexible substrate 40 is formed, as depicted in FIG. 1, so as to have a substantially rectangular shape in a plan view, with one ed connected to the CF substrate 11a and the other end on its opposite side connected to the liquid crystal display flexible substrate 30. As depicted in FIG. 2, in the non-display area NAA of the CF substrate 11a, the peripheral lines 22 connected from the touch electrodes 21 are gathered to form a CF substrate-side terminal 13. This CF substrate-side terminal 13 and the CF substrate-purpose terminal 43 formed at one end side of the touch panel flexible substrate 40 are coupled by a connector or the like, thereby making the touch panel flexible substrate 40 electrically and mechanically connected to the CF substrate 11a. As depicted in FIG. 1 and FIG. 3, on the surface of the liquid crystal display flexible substrate 30, the touch-panel-substrate-purpose terminal 32 is formed between the mount position of the above-described touch driver 60 and the terminal formation area 31a1. This touch-panel-substrate-purpose terminal 32 and a liquid crystal-panel-substrate-purpose terminal 42 formed on the other end side of the touch panel flexible substrate 40 are coupled by a connector or the like, thereby making the touch panel flexible substrate 40 electrically and mechanically connected to the liquid crystal display flexible substrate 30.

The insulator base 31 of the liquid crystal display flexible substrate 30 is provided with the extended portion 31c. In the following, details about the extended portion 31c are described.

The extended portion 31c is formed to extend so as to surround three ways of the terminal formation area 31a1 in a plan view, with the terminal non-formation area 31a2 positioned on both sides of the terminal formation area 31a1 formed to protrude to the main body 31a of the insulator base 31 as described above being taken as a base end, to form an annular shape together with the main body 31a. As depicted in FIG. 1, the extended portion 31c has a width dimension slightly larger than the length dimension of the liquid crystal display driver 50 in the short direction over the entire area. A center portion of the extended portion 31c is an insulating coating portion 31c1, and a curved portion 31c2 is formed between each base end of the extended portion 31c and the insulating coating portion 31c1. In other words, at each side edge of the main body 31a on the liquid crystal panel 11 side, the extended portion 31c with the terminal non-formation area 31a2 positioned on both sides of the terminal formation area 31a1 as a base end swells outward along the X-axis direction while extending to the liquid crystal panel 11 side along the Y-axis direction, is then mildly folded inward to form the curved portion 31c2, and is further extended linearly along the side edge of the main body 31a, that is, along the X axis, to make extended ends mutually coupled. A center portion of this linear-shaped portion configures the insulating coating portion 31c1. By setting each portion of the extended portion 31c so that it has appropriate shape dimensions, the insulating coating portion 31c1 is formed so as to be overlaid and arranged on the surface of the liquid crystal display driver 50 when a panel-connection-purpose terminal and a panel-substrate-side terminal are connected.

The liquid crystal display device 10 according to the present embodiment has the structure as described above, and its operation is described next.

When the power supply of the liquid crystal display device 10 configured as described above is turned ON, various signals regarding images are transmitted from the control circuit substrate not depicted as a signal supply source to the liquid crystal display flexible substrate 30 and the array substrate 11b and, after processed at the liquid crystal display driver 50, supplied to the display area AA of the liquid crystal panel 11. The supplied signals are inputted to the above-described source line or gate line or the like depending on their type to control driving of the liquid crystal panel 11.

On the other hand, a detection signal based on the potential at the touch electrode 21 is transmitted via the touch panel flexible substrate 40 to the liquid crystal display flexible substrate 30 and is processed at the touch driver 60. From the touch driver 60, a control signal for controlling driving of the touch panel pattern 20 is supplied. This control signal is transferred via the liquid crystal display flexible substrate 30 and the touch panel flexible substrate 40 to the touch panel pattern 20 to control driving of the touch panel pattern 20.

As described above, the liquid crystal display device 10 according to the present embodiment includes the liquid crystal panel 11 having the paired substrates 11a and 11b, the touch panel pattern 20 internally inserted into the liquid crystal panel 11, the liquid crystal display flexible substrate 30 including the insulator base with insulation properties and flexibility, the substrate which transmits a signal for driving the liquid crystal panel 11, the liquid crystal display driver 50 which processes a signal from the liquid crystal display flexible substrate 30 for supply to the liquid crystal panel 11 to drive the liquid crystal panel 11 and cause an image to be displayed, and the touch panel flexible substrate 40 which has flexibility and transmits a signal for driving the touch panel pattern 20. The paired substrates 11a and 11b are formed of the CF substrate 11a disposed on the display surface 11DS side of the liquid crystal panel 11 and the array substrate 11b partially overlaid on the CF substrate 11a in a plan view, with one side edge portion being disposed so as to extend from one side edge 11a1 of the CF substrate 11a to form the CF substrate non-overlapping portion 11b2 which is not overlaid on the CF substrate 11a. The liquid crystal display flexible substrate 30 is connected to the CF substrate non-overlapping portion 11b2. The liquid crystal display driver 50 is mounted on the CF substrate non-overlapping portion 11b2. The touch panel flexible substrate 40 has one end connected to the CF substrate 11a and is disposed so as to be at least partially overlaid on the CF substrate non-overlapping portion 11b2 in a plan view. The insulating coating portion 31c1 having insulation properties disposed between the liquid crystal display driver 50 and the touch panel flexible substrate 40 is formed at a portion of the liquid crystal display flexible substrate 30.

According to the present embodiment, in the liquid crystal display device 10 having the liquid crystal display driver 50 COG-mounted thereon, when the liquid crystal display flexible substrate 30 is connected to the liquid crystal panel 11, the insulating coating portion 31c1 as its portion is disposed between the liquid crystal display flexible substrate 30 and the touch panel flexible substrate 40, thereby allowing insulation between the liquid crystal display driver 50 and the touch panel flexible substrate 40. This allows reduction in potential conduction of the liquid crystal display driver 50 via the touch panel flexible substrate 40 while omitting a step only for the purpose of achieving insulation between both members and inhibition of erroneous operation of the liquid crystal display device 10. Since the insulating coating portion 31c1 is formed as a portion of the liquid crystal display flexible substrate 30, it is not required to separately prepare or manage a member for insulation. As a result, compared with a structure in which an insulation tape is affixed to the surface of the liquid crystal display driver 50, it is possible to stabilize the operation of the liquid crystal display device 10, while achieving reduction in the number of operations, the number of components, and cost.

In the present embodiment, the insulating coating portion 31c1 is formed of the insulator base 31.

According to this structure, the insulator base 31 can be formed by only changing the shape of a portion of the conventionally-used insulator base 31. This allows insulation between the touch panel flexible substrate 40 and the liquid crystal display driver 50 with a simple structure without inviting a significant increase in cost or the like.

The insulator base 31 according to the present embodiment is provided with the terminal formation area 31a1 where a terminal for being electrically connected to the array substrate 11b is formed and the terminal no-formation area 31a2 where no terminal is formed, and has formed thereon the extended portion extending, with the terminal non-formation area as a base end. The insulating coating portion 31c1 is provided to the extended portion 31c.

With a portion of the insulator base 31 being disposed between the touch panel flexible substrate 40 and the liquid crystal display driver 50, there is a possibility of occurrence of stress inside the insulator base 31 due to the shape of the liquid crystal display driver 50, in particular, the thickness or the like. According to the above-described structure, the extended portion 31c having the insulating coating portion 31c1 takes the terminal non-formation area 31a2 as a base end, and the extended portion 31c and the terminal formation area 31a1 are not directly connected. Therefore, the stress occurring to the extended portion 31c is not directly transferred to the terminal formation area 31a1, and the influence of the stress to an electrical connection portion can be inhibited. Thus, the effects as described above can be acquired, while favorable connection between the liquid crystal panel 11 and the liquid crystal display flexible substrate 30 is kept. Here, in the present embodiment, the extended portion 31c is formed so as to form an annular shape together with the main body 31a, thereby inhibiting a positional deviation of the extended portion 31c and allowing the insulating coating portion 31c1 to be easily arranged on the liquid crystal display driver 50.

In the present embodiment, in the extended portion 31c of the insulator base 31, provided between its base end and the insulating coating portion 31c is the curved portion 31c2 curved in a plan view.

According to this structure, the insulator base 31 having flexibility is more easily deformed at the curved portion 31c2, and the stress occurring inside the insulator base 31 is absorbed by deformation and displacement of the insulator base 31 at the curved portion 31c2. Thus, conduction of stress to the terminal non-formation area 31a2 at the base end of the extended portion 31c and, in turn, to the terminal formation area 31a1, can be more inhibited.

In the liquid crystal display device 10 according to the present embodiment, the touch panel pattern 20 is internally inserted into the liquid crystal panel 11. In this liquid crystal display device 10, it is not possible to achieve insulation with the liquid crystal display driver 50 by using a portion of the structure of the functional unit, for example, by causing a portion of the touch panel to protrude onto the liquid crystal display driver 50. Even in this liquid crystal display device 10, according to the present technology, insulation between the liquid crystal display driver 50 and the touch panel flexible substrate 40 can be achieved with a simple structure.

Second Embodiment

Figure 4:
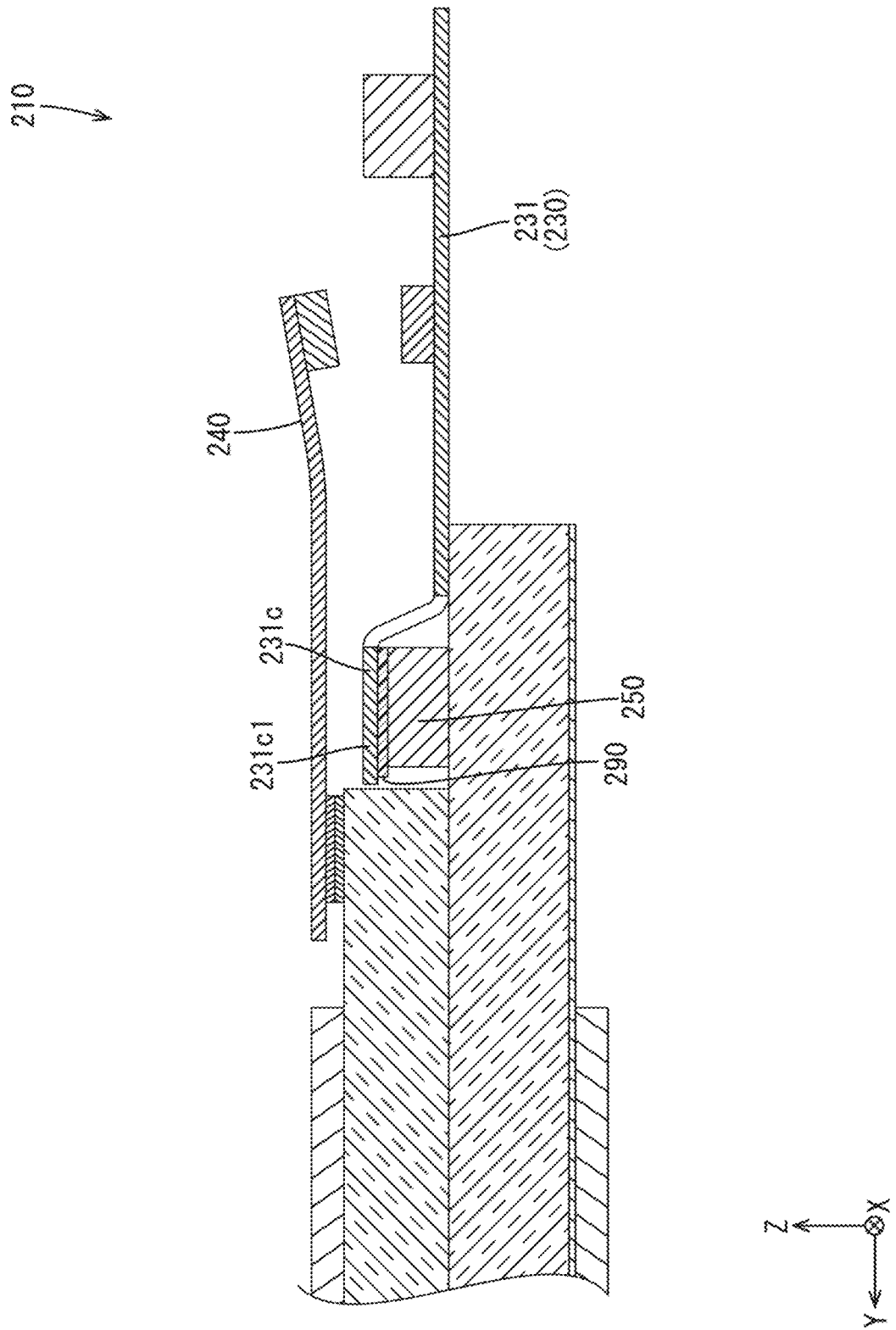
FIG. 4 is a schematic sectional view depicting connection structure of a liquid crystal panel, a liquid crystal display flexible substrate (first flexible substrate), a touch panel flexible substrate (second flexible substrate), a liquid crystal display driver (display driving component), and a touch driver in a liquid crystal display device according to a second embodiment.

A second embodiment is described based on FIG. 4. A liquid crystal display device 210 according to this second embodiment differs in the arrangement structure of an insulating coating portion 231c1 and a liquid crystal display driver 250, compared with the liquid crystal display device 10 according to the first embodiment described above. In the following, redundant description of the structure, operation, and effect similar to those of the above-described first embodiment is omitted (the same goes for a third embodiment).

In a liquid crystal display flexible substrate 230 according to the present embodiment, the insulating coating portion 231c1 formed on an insulator base 231 is bonded via a bonding agent layer 290 to the surface of the liquid crystal display driver 250. The bonding agent layer 290 may be disposed by applying a bonding agent or affixing a double-sided tape onto the back surface of the insulating coating portion 231c1 formed on the insulator base 231, or may be disposed by applying a bonding agent or affixing a double-sided tape onto the surface of the liquid crystal display driver 250.

According to the present embodiment, since the insulating coating portion 231c1 is bonded and fixed via the bonding agent layer 290 to the liquid crystal display driver 250, even if a vibration or impact is added to the liquid crystal display device 210, the insulating coating portion 231c1 is not deviated or detached from the surface of the liquid crystal display driver 250, and the insulation effect can be kept. This allows stable insulation between the liquid crystal display driver 250 and the touch panel flexible substrate 40.

Third Embodiment

Figure 5:
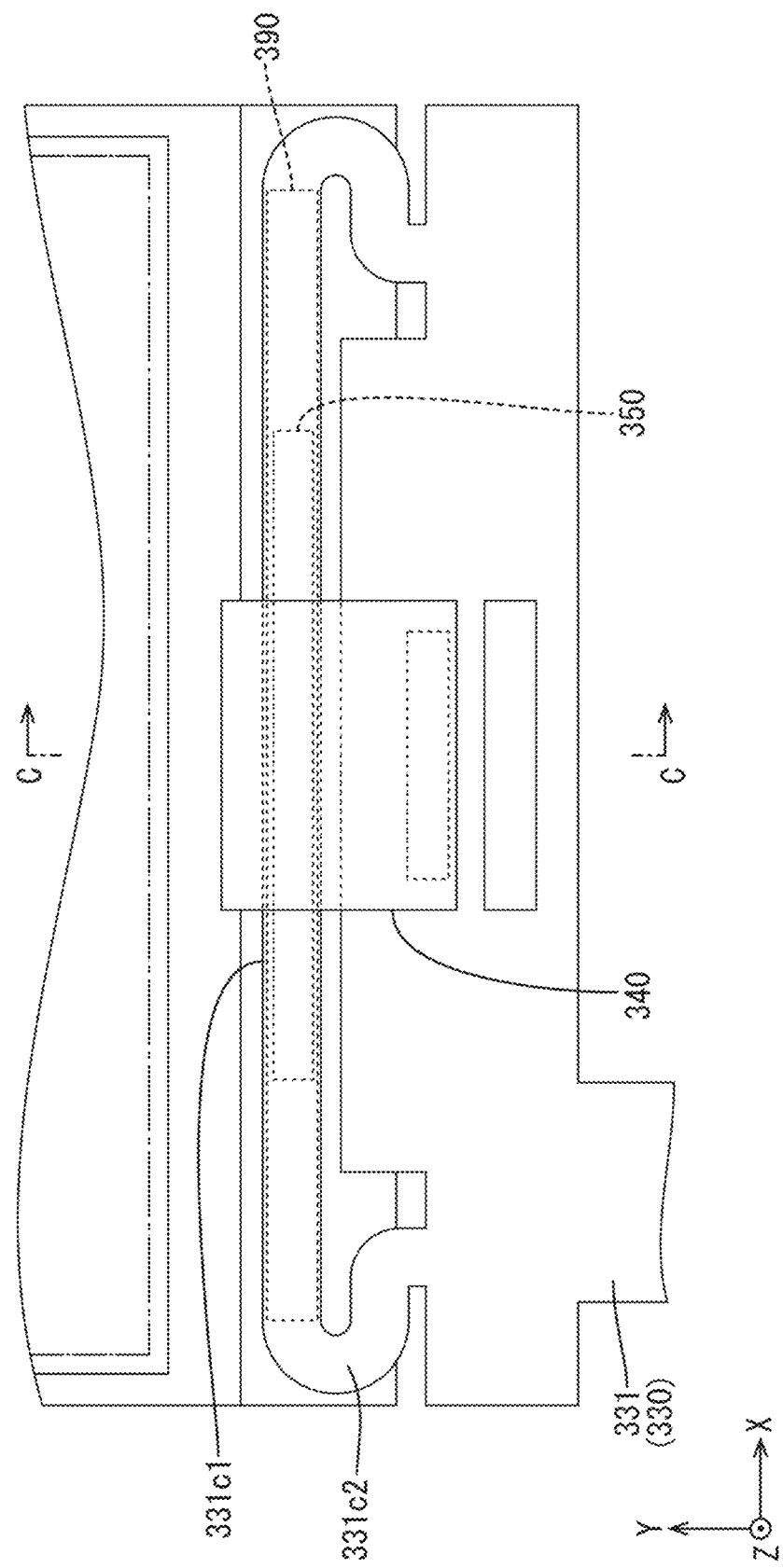
FIG. 5 is an enlarged plan view of a relevant portion of a liquid crystal display device according to a third embodiment depicting connection among a liquid crystal panel, a liquid crystal display flexible substrate (first flexible substrate), a touch panel flexible substrate (second flexible substrate), a liquid crystal display driver (display driving component), and a touch driver.
Figure 6:
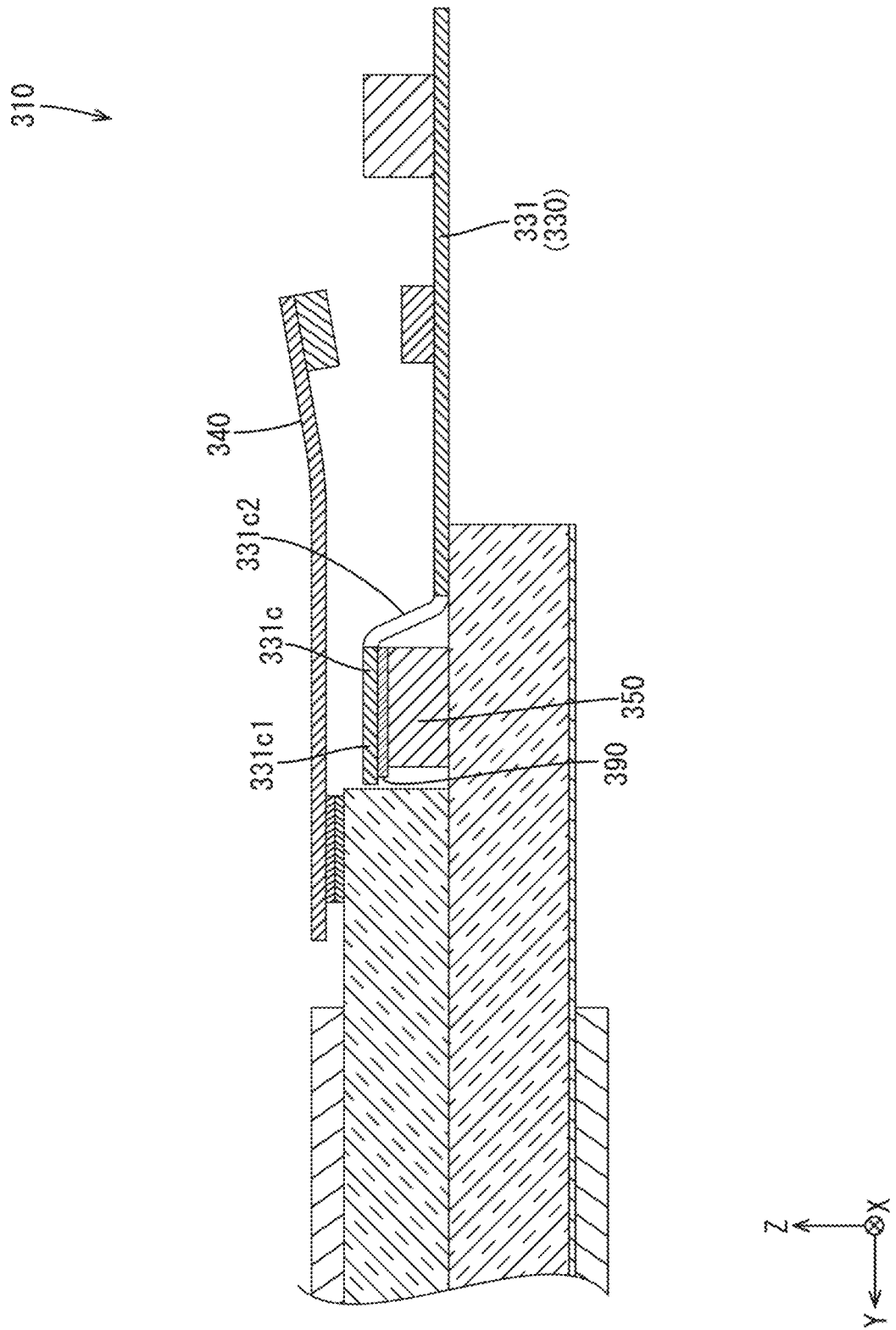
FIG. 6 is a cross-sectional view along line C-C in FIG. 5.

A third embodiment is described based on FIG. 5 and FIG. 6. A liquid crystal display device 310 according to the third embodiment also differs in the structure of an insulating coating portion 331, compared with the liquid crystal display device 10 according to the first embodiment described above.

In the liquid crystal display flexible substrate 330 according to the present embodiment, a copper foil 390 is disposed on the back surface of an extended portion 331c, and the insulator base 331 is overlaid and arranged on the surface of a liquid crystal display driver 350. As depicted in FIG. 5, the copper foil 390 is disposed so as to extend outside in a range including an insulating coating portion 331c1 and not including a curved portion 331c2 of the extended portion 331c.

According to the present embodiment, since the insulating coating portion 331c1 is overlaid via the copper foil 390 with high heat conductivity on the liquid crystal display driver 350, heat generated at the time of operation of the liquid crystal display driver 350 is transferred outside from the liquid crystal display driver 350 via the copper foil 390 and is effectively dissipated. That is, by giving the copper foil 390 a role as a heat-dissipating material, heat generated from the liquid crystal display driver 350 is dissipated to allow an increase in temperature to be inhibited. As a result, even if a high load is exerted on the liquid crystal display driver, this can be stably operated, and the operation of the liquid crystal display device 310 can be stabilized. In the present embodiment, the structure is such that the copper foil 390 is not disposed on the curved portion 331c2, and thus deformation of the curved portion 331c2 is not inhibited by the copper foil 390. Also, while the copper foil 390 is used in the present embodiment, a similar effect can be acquired also when a thin layer made of, for example, stainless steel or another metal is disposed.

Other Embodiments

The present technology is not limited to the embodiments described based on the above description and the drawings and, for example, the following embodiments are also included in this technological scope.

(1) The insulating coating portion formed as portion of the liquid crystal display flexible substrate may be any disposed so as to be overlaid on the surface of the liquid crystal display driver, and the shape of this portion, the shape of the extended portion having this portion and, furthermore, the shape of the insulator base 31 are not particularly limited.

(2) While the example has been described in the above-described embodiments in which the liquid crystal display driver forms a long prismatic shape, the shape of the liquid crystal display driver is not particularly limited. The present technology can be applied to display devices including a liquid crystal display driver in any of various shapes such as a cubic shape and a flat plate shape. In accordance with the shape of the liquid crystal display driver, the insulating coating portion has a shape with dimensions so as to be overlaid on this driver and preferably cover the entire surface of this driver.

(3) While the example has been described in the above-described embodiments in which the touch panel pattern is formed as semi-in-cell, the structure is not limited to this structure. For example, the touch panel pattern may be formed as on-cell. Furthermore, the functional unit is not limited to one having the touch panel function, and may have other functions. The present technology can be effectively applied to a display device configured to include a functional unit which is controlled via a flexible substrate separate from the liquid crystal display flexible substrate, this flexible substrate being possibly adjacent to the liquid crystal display driver.

(4) While the case has been exemplarily described in each of the above-described embodiments in which the present technology is applied to a liquid crystal panel as a display panel, the present technology can be applied also to display panels of other types (such as organic EL panels, PDP (plasma display panels), EPD (electrophoretic display panels), and MEMS (Micro Electro Mechanical Systems) display panels).

(5) While the case has been exemplarily described in each of the above-described embodiments in which the technology according to the specification is applied to a liquid crystal panel classified as a small-sized type or a small- and medium-sized type, the present technology can be applied also to a display device classified as a medium-sized type or a large-sized type (super-sized type) having a screen size of, for example, 20 inches to 90 inches.

EXPLANATION OF SYMBOLS

- 10: liquid crystal display device (display device)
- 11: liquid crystal panel (display panel)
- 11a1: first side edge (one side edge)
- 11a: CF substrate (color filter substrate, opposing substrate. first substrate)
- 11b: array substrate (active matrix substrate, element substrate. second substrate)
- 11b2: CF substrate non-overlapping portion (non-overlapping portion)
- 11c, 11d: polarizing plate
- 20: touch panel pattern (functional unit)
- 30: liquid crystal display flexible substrate (first flexible substrate)
- 31: insulator base
- 31a1: terminal formation area
- 31a2: terminal non-formation area
- 31a: main body
- 31b: projecting portion
- 31c1: insulating coating portion
- 31c2: curved portion
- 31c: extended portion
- 40: touch panel flexible substrate (second flexible substrate)
- 50: liquid crystal display driver (display driving component)
- 60: touch driver

The invention claimed is:

1. A display device comprising:
   a display panel including:
      a first substrate on a display surface side of the display device; and
      a second substrate behind the first substrate and opposed to the first substrate, the second substrate including a non-overlapping portion that does not overlap the first substrate;
   a display driving component mounted on the non-overlapping portion of the second substrate and configured to drive the display panel;
   a first flexible substrate including:
      a main body including a terminal section including second substrate connecting terminals electrically and mechanically connected to the non-overlapping portion of the second substrate and a non-terminal section not including the second substrate connecting terminals and not mechanically connected to the first substrate and the second substrate; and
      an extended portion extending from an end of the main body on an opposite side from the non-terminal section, the extended portion including a curved section connected with the end of the main body and an insulating coating section located over the display driving component;
   a second flexible substrate including:
      a first end including first substrate connecting terminals electrically and mechanically connected to an edge portion of the first substrate adjacent to the non-overlapping portion of the second substrate; and
      a second end not including the first substrate connecting terminals and not mechanically connected to the first substrate and the second substrate; and
   a functional component on the first substrate, wherein
   the functional component is configured to perform a function other than displaying an image,
   the first substrate is a color filter substrate including color filter substrate-side terminals,
   the first substrate connecting terminals of the second flexible substrate are electrically and mechanically connected to the color filter substrate-side terminals,
   the second substrate is an array substrate including switching components and pixel electrodes,
   the second end of the second flexible substrate includes a display panel connecting terminal,
   the first flexible substrate includes a functional component driver and a functional component connecting terminal,
   the function component driver is configured to drive the functional component, and
   the functional component connecting terminal is connected to the display panel connecting terminal.

2. The display device according to claim 1, wherein the functional component includes touch electrodes arranged in a matrix within the display surface of the display device to detect a position of input.

3. The display device according to claim 1, further comprising a bonding agent layer between the insulating coating section and the display driver to bond the insulating coating section to the display driver.

4. The display device according to claim 1, further comprising a metal layer between the insulating coating section and the display driver, wherein
the metal layer includes a first surface that contacts the display driver and a second surface that contacts the insulating coating section.

\* \* \* \* \*